United States Patent [19]
Yoshida et al.

[11] Patent Number: 5,959,240
[45] Date of Patent: Sep. 28, 1999

[54] THERMOELECTRIC CONVERTER FOR HEAT-EXCHANGER

[75] Inventors: Shuichi Yoshida, Handa; Kazuhiko Aoki, Nagoya, both of Japan

[73] Assignee: NGK Insulators, Ltd., Japan

[21] Appl. No.: 08/982,377

[22] Filed: Dec. 2, 1997

[30] Foreign Application Priority Data

Dec. 4, 1996 [JP] Japan .................................. 8-323694

[51] Int. Cl.⁶ .................................................. H01L 35/30
[52] U.S. Cl. ........................ 136/205; 136/203; 136/242; 62/3.2; 62/3.3
[58] Field of Search .................... 136/203, 204, 136/205, 212, 242; 62/3.2, 3.3, 3.4, 3.5, 3.6, 3.7

[56] References Cited

U.S. PATENT DOCUMENTS

| | | | |
|---|---|---|---|
| 2,938,357 | 5/1960 | Sheckler | 136/203 |
| 3,006,979 | 10/1961 | Rich | 136/203 |
| 4,065,936 | 1/1978 | Fenton et al. | 62/3 |
| 4,292,579 | 9/1981 | Constant | 322/2 R |
| 4,730,459 | 3/1988 | Schlicklin et al. | 62/3 |
| 4,971,632 | 11/1990 | Rowe | 136/212 |
| 5,254,178 | 10/1993 | Yamada et al. | 136/204 |
| 5,362,983 | 11/1994 | Yamamura et al. | 257/414 |
| 5,441,576 | 8/1995 | Bierschenk et al. | 136/203 |

FOREIGN PATENT DOCUMENTS

| | | |
|---|---|---|
| 58-44842 | 10/1983 | Japan . |
| 60-35968 | 2/1985 | Japan . |
| 05063244 | 9/1991 | Japan . |
| 4-86973 | 3/1992 | Japan . |
| 07176796 | 12/1993 | Japan . |
| 08204242 | 1/1995 | Japan . |
| 08293628 | 4/1995 | Japan . |
| 08288557 | 9/1995 | Japan . |
| 09148634 | 11/1995 | Japan . |
| 09181360 | 12/1995 | Japan . |
| 10093148 | 9/1996 | Japan . |
| 10093149 | 9/1996 | Japan . |

*Primary Examiner*—Kathryn Gorgos
*Assistant Examiner*—Thomas H. Parsons
*Attorney, Agent, or Firm*—Parkhurst & Wendell, L.L.P.

[57] ABSTRACT

A thermoelectric power generator module having a plurality of thermoelectric elements is provided to a heat conduction wall of a heat-exchanger for recovering waste heat of an incinerator and so on so as to perform a power generation. An insulator positioned at a hot side of the thermoelectric power generator module is faced to a hot fluid, and an insulator positioned at a cold side of the thermoelectric power generator module is faced to a cold fluid, so that a large temperature difference over 200° C. can be obtained.

3 Claims, 4 Drawing Sheets

THERMOELECTRIC CONVERTER FOR HEAT-EXCHANGER

BACKGROUND OF THE INVENTION

1. Field of the Invention

The present invention relates to a thermoelectric converter for a heat-exchanger, which generates electricity by utilizing a temperature difference between a hot surface and a cold surface of a heat conduction wall of the heat-exchanger, and especially relates to a thermoelectric converter for a heat-exchanger preferably used for generating electricity by utilizing the waste heat from a waste incinerator.

2. Related Art Statement

If a temperature is applied to a connection portion between different kinds of conductors or between different kinds of semiconductors, an electromotive force is generated between a hot side and a cold side. This phenomenon is well known as the Seebeck effect. Moreover, it is well known that heat is directly converted into electric power by using a thermoelectric converting element having such a property.

For example, in Japanese Patent Laid-Open Publication No. 4-86973 (JP-A-4-86973), there is a description such that a thermoelectric power generator module is provided to a wall surface of a combustion chamber made of quartz glass for burning butane gas so as to perform a thermoelectric power generation. The thermoelectric power generator module has a construction such that a plurality of thermoelectric elements are combined to form a thermoelectric element module and insulators are provided to both end surfaces of the thermoelectric element module so as to increase an electromotive force. In the technique described in this publication, a fuel is burnt to perform a thermoelectric power generation. However, since the current rate of efficiency of a thermoelectric conversion is at about 10%, there is a drawback in that the thermoelectric conversion efficiency is low as compared with the other direct thermoelectric conversion systems such as a fuel cell.

Recently, a system has been discussed in which a fuel is burnt not for the thermoelectric power generation, but the thermoelectric power generation is performed to recover an energy from a waste heat. For example, in Japanese Patent Publication No. 58-44842 (JP-B-58-44842), a technique is described in which the thermoelectric power generator module is arranged to an exhaust pipe through which an exhaust gas flows having a high temperature from an engine, so as to perform a recovery of waste heat. In this technique, a suction of the open air is performed by utilizing a venturi effect of the exhaust gas at an outlet of the exhaust pipe and a large temperature difference is maintained. However, in a general incinerator or heating furnace, it is not easy to maintain a large temperature difference mentioned above, and thus it is necessary to use a special cooling device for cooling an exhaust gas to obtain such a large temperature difference. Therefore, there is a drawback that it is difficult economically to perform an energy recovery from a waste heat by using the thermoelectric power generator module.

SUMMARY OF THE INVENTION

An object of the present invention is to eliminate the drawbacks mentioned above and to provide a thermoelectric converter for a heat-exchanger which can perform a power generation economically in a general incinerator or heating furnace without using a special cooling device for cooling an exhaust gas.

According to the invention, a thermoelectric converter for a heat-exchanger comprises a thermoelectric power generator module in which insulators are provided to both end surfaces of a plurality of thermoelectric elements, wherein the thermoelectric power generator module is provided to a heat conduction wall of the heat-exchanger in such a manner that one of the insulators is faced towards a hot fluid of the heat-exchanger and the other insulator is faced towards a cold fluid of the heat-exchanger.

In the present invention, since the thermoelectric power generator module is provided to the heat conduction wall of the heat-exchanger, one of the insulators positioned at a cold side is cooled by a cold fluid flowing through the heat-exchanger. Therefore, it is easy to maintain a large temperature difference over 200° C., even if a temperature of a hot fluid is not so high. Moreover, since it is not necessary to use a special cooling device, the thermoelectric power generation can be performed economically.

DESCRIPTION OF THE PREFERRED EMBODIMENTS

Figure 1:
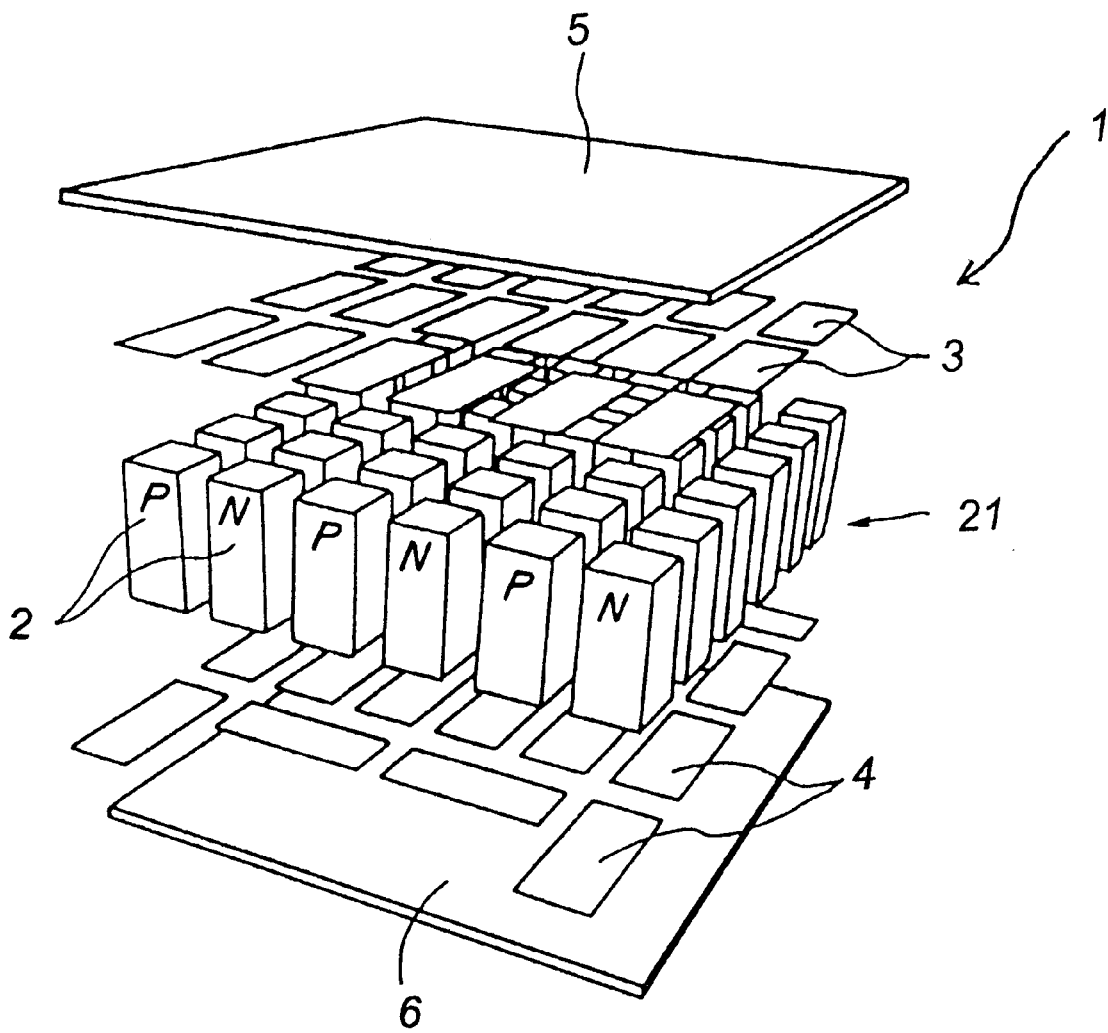
FIG. 1 is a perspective view showing one embodiment of a thermoelectric power generator module.

FIG. 1 is a perspective view showing one embodiment of a thermoelectric power generator module 1 used in the present invention. As shown in FIG. 1, the thermoelectric power generator module 1 has a following construction. That is to say, a plurality of thermoelectric elements 2 made of P-type semiconductor and N-type semiconductor are combined to form a thermoelectric element module 21. Metal plates 3 and 4 are arranged on both end surfaces of the thermoelectric element module 21 in such a manner that the thermoelectric elements mutually made of P-type semiconductor and N-type semiconductor are connected in series as shown in FIG. 1. Then, insulators 5 and 6 are provided on the end surfaces of the thermoelectric element module 21 respectively via the metal plates 3 and 4. A power density of the thermoelectric power generator module 1 is about 0.01–0.5 W/cm$^2$ corresponding to a temperature difference between the insulators 5 and 6.

Figure 2:
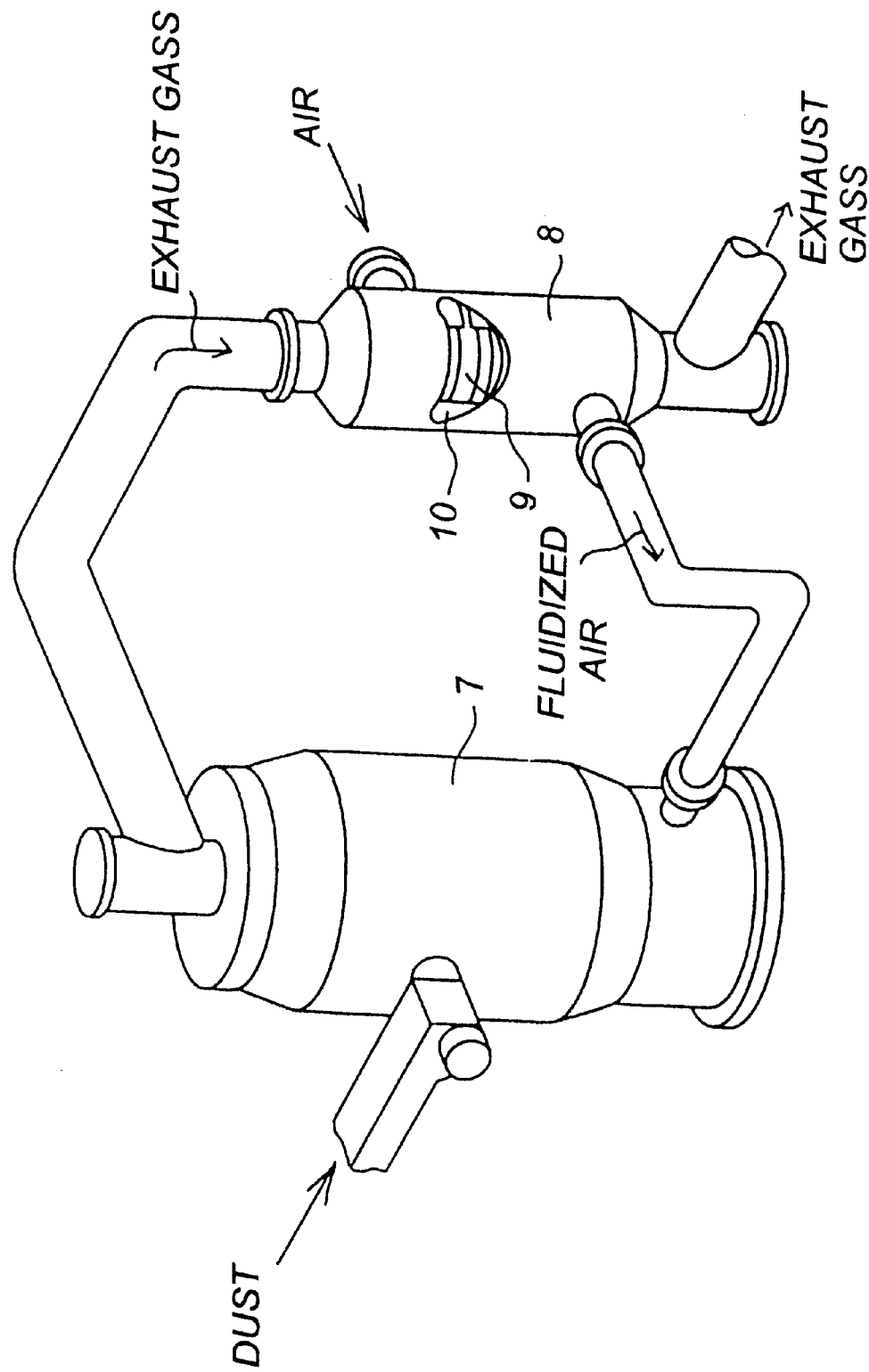
FIG. 2 is a perspective view illustrating one embodiment of a thermoelectric converter for a heat-exchanger according to the invention.

In FIG. 2, a numeral 7 is an incinerator. Here, an incinerator of a fluidized bed type for a burning of municipal waste is shown. Moreover, a numeral 8 is a heat-exchanger to which an exhaust gas of the incinerator 7 is introduced. In the heat-exchanger 8, a heat exchange between the exhaust gas and the air is performed and a preliminarily heated air is supplied to the incinerator 7 via return means 12 as a fluidized air.

Figure 3:
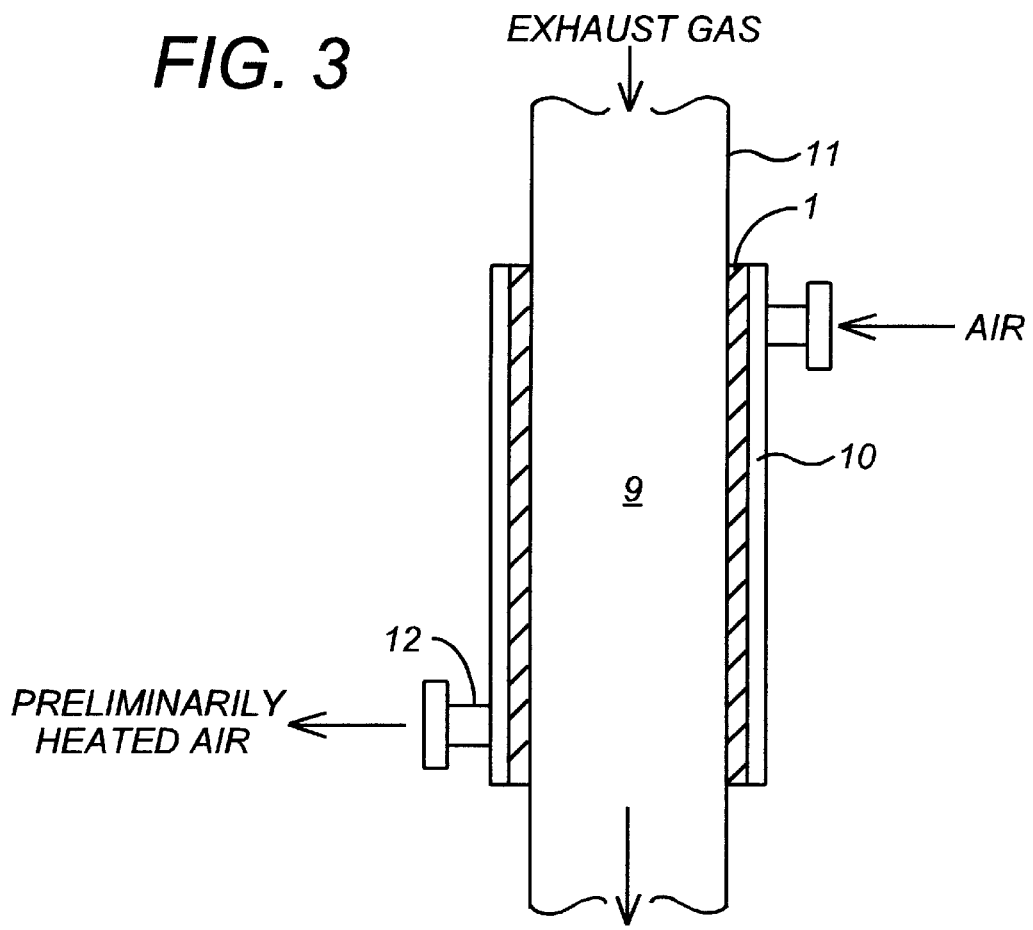
FIG. 3 is a cross sectional view depicting one embodiment of a heat-exchanger to which the thermoelectric converter according to the invention is provided.
Figure 4:
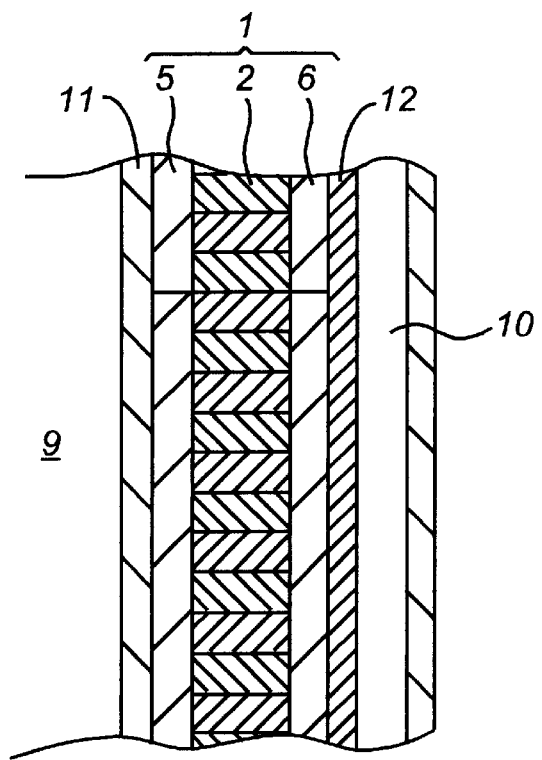
FIG. 4 is an enlarged cross sectional view showing one embodiment of a heat conduction wall of the heat-exchanger to which the thermoelectric converter according to the invention is provided.

FIG. 3 is a cross sectional view showing one embodiment of the heat-exchanger 8. In FIG. 3, an exhaust gas passage 9 is arranged at a center of the heat-exchanger 8 and an air passage 10 is arranged at an outer surface of a heat conduction wall 11 of the heat-exchanger 8 via the thermoelectric power generator module 1. FIG. 4 is an enlarged cross sectional view showing one embodiment of the heat conduction wall 11. In FIG. 4, the thermoelectric power generator module 1 is provided on an outer surface of the heat conduction wall 11 which constructs the exhaust gas passage 9. That is to say, the insulator 5 of the thermoelectric power generator module 1 positioned at a hot side is brought into contact with the heat conduction wall 11, and the insulator 6 of the thermoelectric power generator module 1 positioned at a cold side is directly exposed in the air passage 10. If the thermoelectric power generator module 1 is provided as shown in FIG. 4, it is possible to prevent an erosion of the thermoelectric power generator module 1 due to the exhaust gas and also prevent an adhesion of waste in the exhaust gas to the thermoelectric power generator module 1.

In the case that a cold fluid of the heat-exchanger 8 is air, the insulator 6 of the thermoelectric power generator module 1 positioned at a cold side can be directly brought into contact with the cold fluid as mentioned above, and thus it is possible to improve a cooling efficiency. However, in the case that a cold fluid of the heat-exchanger 8 is a liquid such as water or an erosive gas, it is necessary to arrange a partition wall 12 on an outer surface of the insulator 6 positioned at a cold side so as to protect the thermoelectric power generator module 1.

In the embodiments mentioned above, the heat conduction wall 11 and the partition wall may be made of a metal such as steel.

Figure 5:
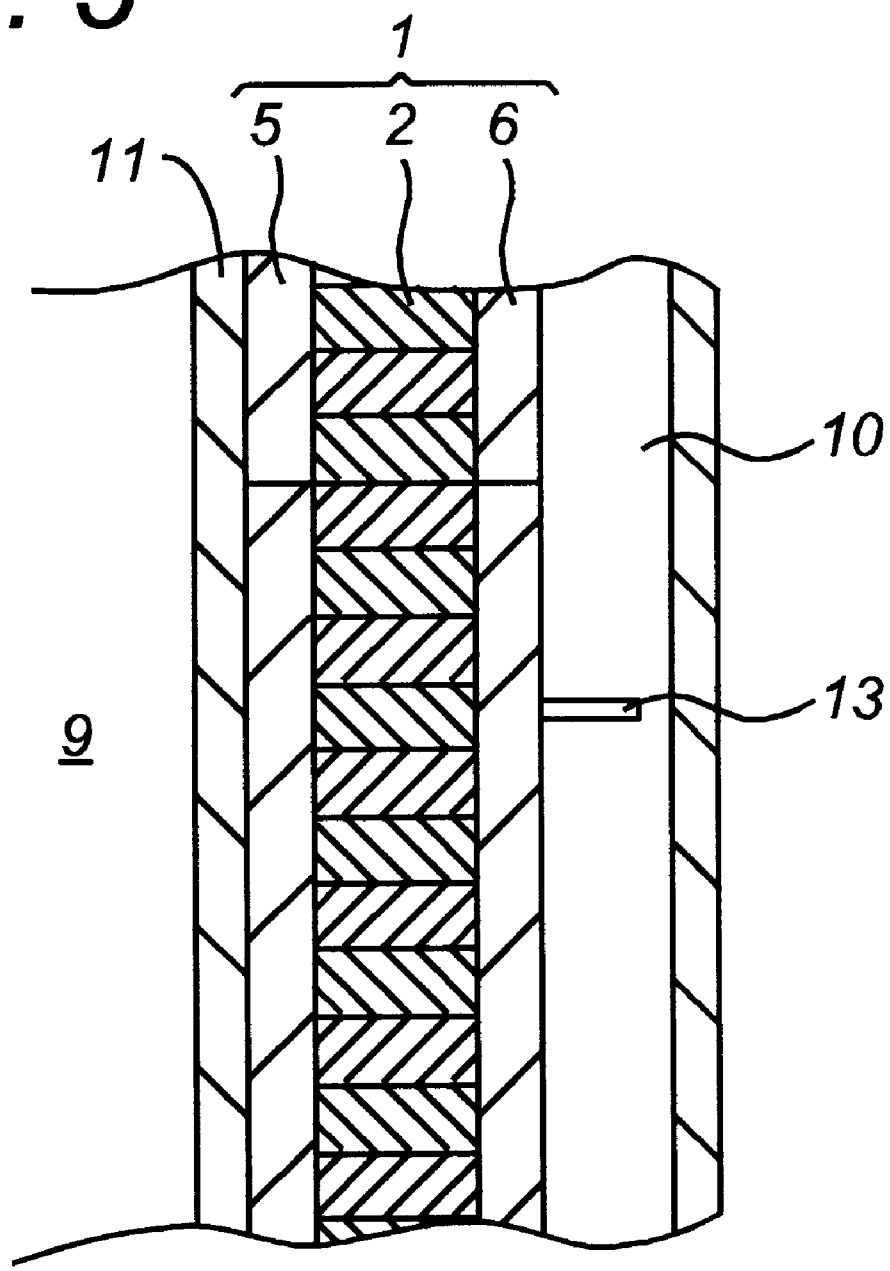
FIG. 5 is an enlarged cross-sectional view showing another embodiment of a heat conduction wall of the heat exchanger to which the thermal electric converter according to the invention is provided.

In the thermoelectric converter for the heat-exchanger according to the invention mentioned above, the insulator 5 of the thermoelectric power generator module 1 positioned at a hot side is heated by the exhaust gas having a high temperature which is a hot fluid of the heat-exchanger 8, and the insulator 6 positioned at a cold side is cooled by the air having a low temperature which is a cold fluid of the heat-exchanger 8. In this case, it is easy to obtain a temperature difference over 200° C. without using a special cooling device. This temperature difference in the thermoelectric power generator module 1 serves as a continuous power generation by the thermoelectric power generator module 1, which amount sufficiently deals with a power necessary for a blower and so on in a waste incinerator as described below. Moreover, if a cooling fin 13 (see FIG. 5) is arranged at a cold side of the thermoelectric power generator module 1, it is possible to improve a heat exchanging efficiency between the insulator 6 positioned at a cold side and the cold fluid, and thus it is possible to maintain a still larger temperature difference.

Theoretically, an air preliminarily heating property of the heat-exchanger 8 is decreased a little if the thermoelectric power generator module 1 is provided. However, in the case of the waste incinerator, a waste itself has a self-burnt property and a large amount of waste heat is generated by burning the waste. In addition, since a power generation efficiency of the thermoelectric power generator module 1 is about 10%, a ratio of energy derived as a power is low. Therefore, even if the thermoelectric power generator module 1 is provided, actual troubles do not occur.

The present invention can be applied to various kinds of heat-exchanger, but can be preferably applied to the heat-exchanger especially used for a waste heat recovery of the incinerator. Among them, the present invention can be preferably applied for a waste incinerator having a relatively small size (lower than 80 ton/day). The reason is as follows. Even if a waste heat boiler is provided to the incinerator having a relatively small size, a boiler efficiency is low, and thus a cost performance is bad. However, the thermoelectric power generation is not affected by a size of the incinerator, and thus it is possible to obtain an output power relative to a contact area between the thermoelectric power generator module and the heat conduction wall of the incinerator. Moreover, in a sewage incinerator, it is usual to perform a 24 hour continuous operation, and thus the waste boiler can be preferably used. Contrary to this, in the waste incinerator having a relatively small size, it is usual to operate the waste incinerator only during a daytime, and thus the waste heat boiler which is affected by a temperature variation is not preferably used. However, even if a temperature variation is applied to the thermoelectric power generator module, there is no fear of damage. Therefore, the thermoelectric power generation is preferably used for the waste incinerator having a relatively small size.

Hereinafter, an actual embodiment will be explained. The thermoelectric power generator module having an area of 18 $m^2$ was provided to the heat conduction wall of the heat-exchanger, to which the exhaust gas from the incinerator of fluidized bed type (waste processing efficiency is 80 ton/day) provided in the waste processing site is introduced. During the operation of the incinerator of fluidized bed type, a hot side of the thermoelectric power generator module was maintained at 400° C. and a cold side of the thermoelectric power generator module was maintained at 200° C. As a result, a power density was 165 $kW/m^2$ and an electric power of 2000 kWh/month was obtained. The electric power thus obtained could be utilized effectively for driving an incidental equipment of the incinerator of fluidized bed type. Moreover, if the thermoelectric power generator module was provided, an operation of the incinerator of the fluidized bed type was not affected at all.

As mentioned above, according to the present invention, the following advantages can be obtained.

(1) It is possible to perform a power generation economically by using an exhaust gas of an incinerator or a heating furnace.

(2) It is not necessary to use a special cooling apparatus since a cold side of the thermoelectric power generator module is cooled by using a cold fluid of the heat-exchanger.

(3) It is possible to be used in an incinerator having a relatively small size in which a temperature variation is large.

(4) Since no moving portions are necessary, a vibration and a noise do not occur.

(5) No maintenance is necessary for a long time.

What is claimed is:

1. A thermoelectric converter for a heat exchanger that receives as a by-product a waste heat of an exhaust gas from an incinerator, said thermoelectric converter comprising:

a thermoelectric power module comprising a plurality of thermoelectric elements connected to form a first end surface and a second end surface;

a first insulator having a front side adjacent to the first end surface of the thermoelectric elements;

a second insulator having a front side adjacent to the second end surface of the thermoelectric elements;

said first insulator having a rear side adjacent to a heat conduction wall, said heat conduction wall facing a hot air passageway of exhaust gas by-product from the incinerator to form a hot side of the heat exchanger;

said second insulator having a rear side that faces a cold fluid passageway to form a cold side of the heat exchanger; and return means communicating with the cold fluid passageway to permit fluidized air heated from an exchange of heat in the heat exchanger to be returned to the incinerator.

2. A thermoelectric convertor according to claim 1, further comprising:

a partition wall in the cold side of the heat exchanger between said second insulator and the cold fluid passageway to protect said second insulator from a corrosive fluid.

3. A thermoelectric converter according to claim 1, further comprising at least one cooling fin attached to the rear side of said second insulator.

* * * * *